United States Patent [19]

Fujihira et al.

[11] Patent Number: 5,723,890
[45] Date of Patent: Mar. 3, 1998

[54] MOS TYPE SEMICONDUCTOR DEVICE

[75] Inventors: Tatsuhiko Fujihira; Takeyoshi Nishimura; Takashi Kobayashi, all of Nagano, Japan

[73] Assignee: Fuji Electric Co., Ltd., Japan

[21] Appl. No.: 643,760

[22] Filed: May 6, 1996

Related U.S. Application Data

[63] Continuation-in-part of Ser. No. 452,789, May 30, 1995, abandoned, which is a continuation-in-part of Ser. No. 368,815, Jan. 6, 1995, abandoned.

[30] Foreign Application Priority Data

| Jan. 7, 1994 | [JP] | Japan | 6-000364 |
| May 24, 1994 | [JP] | Japan | 6-108873 |
| Nov. 10, 1994 | [JP] | Japan | 6-276196 |
| Nov. 21, 1994 | [JP] | Japan | 6-286254 |

[51] Int. Cl.$^6$ .................. H01L 29/94; H01L 29/06
[52] U.S. Cl. .................. 257/339; 257/342; 257/487
[58] Field of Search .................. 257/328, 329, 257/335, 339, 341, 342, 345, 139, 133, 401, 487

[56] References Cited

U.S. PATENT DOCUMENTS 4,801,986  1/1989  Chang et al. .................. 257/139
5,208,471  5/1993  Mori et al. .................. 257/327
5,286,984  2/1994  Nakagawa et al. .................. 257/139
5,396,097  3/1995  Robb et al. .................. 257/341

FOREIGN PATENT DOCUMENTS

| 0 091 079 | 12/1983 | European Pat. Off. . |
| 3823270 A1 | 3/1989 | Germany . |
| 63-152174 | 6/1988 | Japan . |
| 2 127 222 | 4/1984 | United Kingdom . |

Primary Examiner—Jerome Jackson
Assistant Examiner—John Guay
Attorney, Agent, or Firm—Rossi & Associates

[57] ABSTRACT

A MOS type semiconductor device with improved voltage and avalanche withstand capability includes a rectangular channel region of the second conductivity type formed in a surface layer of a semiconductor substrate of the first conductivity type, a heavily doped well region formed in the central part of the channel region, source regions of the first conductivity type formed in a surface layer of the channel region, and a surface MOS structure. The quadrangular cells are arranged so that a side of the cell may contact with a side of the neighboring cell. By joining the short sides of the neighboring channel regions, protruding portions such as the corners, to which the avalanche current tend to localize, of the channel region are eliminated. As a result, the avalanche withstand capability of the MOSFET is improved. Further, since the curvature of the depletion layer becomes small, the withstand voltage is improved.

13 Claims, 9 Drawing Sheets

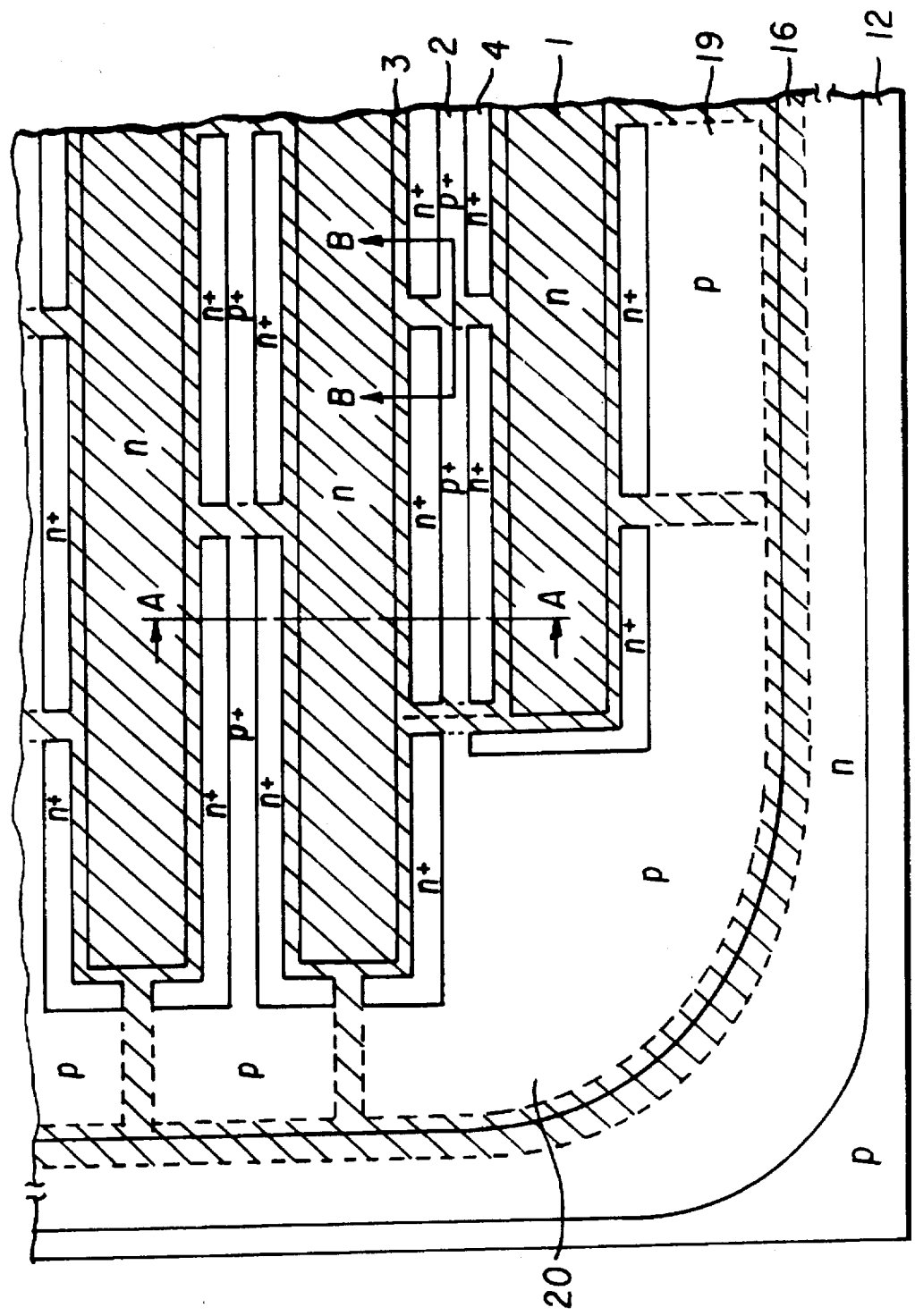
FIG. I

MOS TYPE SEMICONDUCTOR DEVICE

CROSS-REFERENCE TO RELATED APPLICATIONS

This application is a continuation-in-part application of Ser. No. 08/452,789 filed May 30, 1995, now abandoned, the contents of which are incorporated herein by reference, which in turn is a continuation-in-part of Ser. No. 08/368, 815 filed Jan. 6, 1995, now abandoned, the contents of which are incorporated herein by reference.

FIELD OF THE INVENTION

The present invention relates to MOS type semiconductor devices such as MOS field effect transistors (hereinafter referred to as MOSFET), insulated gate bipolar transistors, etc. which are comprised of a plurality of source regions, which have a gate with a metal-oxide film—semiconductor (MOS) structure, distributed in a surface layer of a semiconductor substrate, and a method of manufacturing the MOS type semiconductor device.

BACKGROUND OF THE INVENTION

The MOS type semiconductor devices have been used very often in switching circuits because of their low ON-resistance and fast switching speed. FIGS. 4(a) to 4(c) show an example of the conventional MOS type semiconductor devices, in which FIG. 4(a) is a top plan view, FIG. 4(b) a sectional view along C—C of FIG. 4(a), and FIG. 4(c) a sectional view along D—D of FIG. 4(a). In FIGS. 4, a plurality of (p+) well regions 2 are formed in a surface layer of an (n) type semiconductor layer 1. A plurality of (p) type channel regions 3 are formed around the (p+) well region 2. Source regions 4 of (n+) type are formed in a surface layer of the (p) type channel region 3. A gate electrode 5, made for example of polycrystalline silicon, is disposed through a gate oxidize film 6 on the surface of the (p) type channel region 3 and over the exposed surface of the (n) type layer 1 between the source regions 4 and 4. A source electrode 8 of Al—Si alloy, which contacts commonly with the (p+) well regions 2 and the (n+) source regions 4 and is insulated from the gate electrodes 5 by an inter-layer insulation film 7 of BPSG (boron phosphorus silicate glass), which extends over the gate electrodes 5. Though not illustrated in the figure, a drain electrode comprised of Al—Si alloy is disposed on the back surface of the (n) type semiconductor layer 1.

Hereinafter, a unit structure comprised of the (p) type channel region 3, the (n+) source regions 4, 4, and the source electrode 8 as shown in FIGS. 4 is referred to as "cell". Though the cell shown in FIG. 4(a) is explained by designating the cell as a "quadrangular cell", the corners of the cell rarely have an angle of 90° or less. In the actual semiconductor devices, the corner of the cell is more or less rounded. Alternatively, the actual cell is formed in an octagon by cutting off the corners of a quadrangular cell. Hereinafter, a polygonal cell, which is defined by two pairs of parallel major sides and extensions of the non-parallel major sides which cross at around a right angle, will be referred to as "quadrangular cell". In an actual MOSFET, many quadrangular cells are arranged side by side. The (n) type layer may be a (n) type semiconductor substrate or a semiconductor layer itself laminated by epitaxial growth etc. on a (p) or (n) type semiconductor substrate.

Recently, since snubber circuits have been eliminated from switching circuits for circuit simplification and since the down-sizing of the switching circuits has been advanced, MOSFETs used as the switching devices in the switching circuits tend to be affected by surge voltage. Since the surge voltage causes breakdown of the MOSFET, improvement of breakdown withstand capability (avalanche withstand capability) of the MOSFETs has been required. In the above described conventional MOSFET, the (p+) well region 2 is formed deeply to improve the avalanche withstand capability. However, the deep (p+) well region impacts other device properties such as ON-resistance of the MOSFETs.

FIG. 5 shows the avalanche withstand capability (solid line) and ON-resistance (broken line) versus (p+) well depth relations in a MOSFET element with ratings of 900 V and 5 A. in FIG. 5, the axis of abscissa represents diffusion depth of the (p+) well region 2 and the axis of ordinate represents avalanche withstand capability and ON-resistance. As shown in FIG. 5, the avalanche withstand capability is improved with increasing depth of the (p+) well region 2. However, the ON-resistance increases also with increasing depth of the (p+) well region 2. Therefore, it takes a considerable period of time to experimentally determine the manufacturing process parameters for obtaining depth of the (p+) well region 2 at which the avalanche withstand capability is appropriately balanced with the ON-resistance. Thus, as far as the avalanche withstand capability is balanced with the ON-resistance, improvement of the avalanche withstand capability remains within a limited range.

In view of the foregoing, it is an object of the present invention is to provide a MOS type semiconductor device which improves avalanche withstand capability without sacrificing other properties.

SUMMARY OF THE INVENTION

The object of the present invention is achieved by a MOS type semiconductor device which includes a semiconductor layer of a first conductivity type, a plurality of quadrangular cells, each of which has four major sides and further includes a channel region of a second conductivity type formed in a surface layer of the semiconductor layer and one or two source regions of the first conductivity type formed in the surface layer of the channel region, at least two sides of which lie in parallel to at least two sides of the channel region, in which MOS type semiconductor device a side of the channel region is joined in parallel to a side of the channel region of the neighboring cell.

When the quadrangular cell is a rectangular cell, it is preferable to join a short side of the rectangular cell to a side of the channel region of a neighboring cell in parallel. In addition, it is more preferable to join the short side of the rectangular cell to a short side of the channel region of the neighboring cell in parallel.

It is also preferable to join another cell in perpendicular to the short sides joined in parallel.

It is also further preferable to arrange peripheral cells, in which at least a portion of the outermost side of its channel region lies in parallel to the side of a semiconductor chip, on the outermost periphery of the semiconductor chip and to surround the quadrangular cells by peripheral cells. In addition, it is preferable to arrange the source region of the first conductivity type of the peripheral cell on the central side of the semiconductor chip. The area of the peripheral cell is preferably wider than the area of the quadrangular cell.

It is preferable to arrange corner cells in the corners of the semiconductor chip. The outermost side of a channel region of the corner cells is preferably an arc convex toward the corner of the semiconductor chip or a polygonal line imitating an arc convex toward the corner of the semiconductor chip. The area of the corner cell is preferably wider than the area of the peripheral cell.

It is preferable to form shallow base region of a second conductivity type in a portion of the surface layer of the channel region. The impurity concentration of the base region is preferably higher than the impurity concentration of the channel region and the diffusion depth of the base region shallower than the diffusion depth the channel region.

The region of the second conductivity type formed under the shallow base region is preferably consisted only of the channel region. It is preferable to form a gate electrode on each joined portion of the channel regions.

It is preferable to join the channel regions by lateral impurity diffusion.

BRIEF DESCRIPTION OF THE DRAWINGS

The invention will be described in greater detail with reference to the accompanying drawings, wherein:

FIG. 1 is a top plan view showing the first embodiment of a MOSFET of the present invention from which an upper structure of the MOSFET is omitted;

DETAILED DESCRIPTION OF THE PREFERRED EMBODIMENTS

Figure 6A:
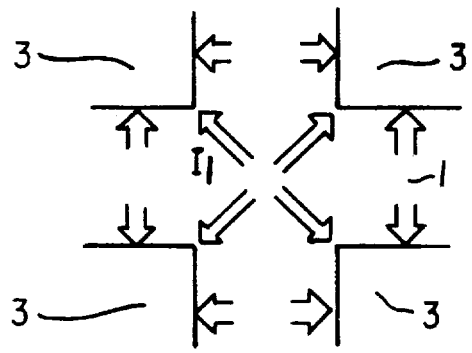
FIG. 6(a) is a top plan view for explaining flow of avalanche currents in the conventional MOSFET from which an upper structure of the MOSFET is omitted.
Figure 6B:
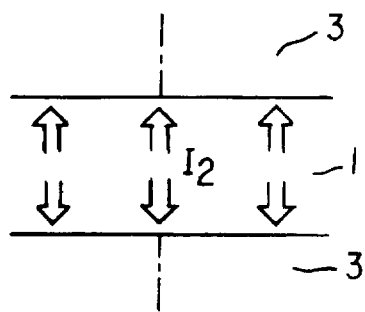
FIG. 6(b) is a top plan view for explaining flow of avalanche currents in the MOSFET according to the present invention.
Figure 7:
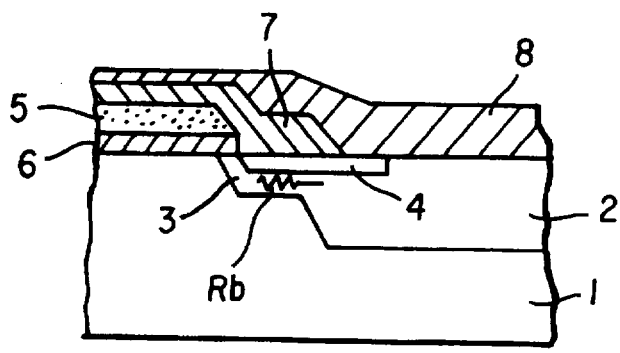
FIG. 7 is a sectional view showing a parasitic bipolar transistor which appears near the surface of the MOSFET.

Prior to discussing exemplary embodiments of the invention, some background information will be discussed with reference to conventional MOSFET structures. FIG. 6(a), for example, is a top plan view for explaining flow of avalanche currents in a conventional MOSFET, and FIG. 6(b) is a top plan view for explaining flow of avalanche currents in the MOSFET according to the present invention. In FIG. 6(a), the distance between the channel regions 3 around the corners of the cells is longer than the distance between the sides of the channel regions 3. Since a withstand voltage is low around the corner of the cells because of large curvature of the (p) type channel region 3, the avalanche currents I1 caused by avalanche breakdown localize to four corners of the (p) type channel region 3 from a region surrounded by the four corners of the channel regions 3 as shown in FIG. 6(a). Because of this, the avalanche withstand capability of the MOSFET lowers around the corner of the quadrangular cells. In contrast, if channel regions are joined on their sides as shown in FIG. 6(b), the corners of the channel regions, to which the avalanche currents may localize, are eliminated. Then, since avalanche currents I2 flow to two opposed facing sides of the channel regions 3, 3, the avalanche withstand capability is improved. As a result, the avalanche current, which flows through the resistance Rb of the (p) type channel region 3 beneath the (n+) source region 4 shown in FIG. 7, decreases. The avalanche current decrease prevents a parasitic bipolar transistor, consisted of the (n) type layer 1, the (p) type channel region 3 and the (n+) source regions 4, 4, from mis-firing, and therefore, prevents the MOSFET from being broken down. In this configuration, the curvature of the pn junction is decreased and the withstand voltage is improved.

The corners of the channel regions are also eliminated by joining a channel region in perpendicular to two channels joined in parallel so as to arrange the channel regions in a lattice. In this arrangement, since no corners remain to which the avalanche currents localize, the avalanche withstand capability and the withstand voltage are improved.

By aligning at least a portion of the outermost side of the channel region of the peripheral cells, formed on the outermost periphery, inside of which the quadrangular cells are formed, in parallel to the side of the semiconductor chip, the pn junction is formed in straight and localization of the electric field is suppressed. By forming the source region of the peripheral cell only on its central side of the semiconductor chip, the parasitic transistor is prevented from operating even when the avalanche current flows, because the source region of the first conductivity type is not formed on the peripheral side of the peripheral cell. Further, by expanding the area of the peripheral cell more widely than the area of the quadrangular cell, the avalanche energy absorption capability, and therefore, the avalanche withstand capability are improved.

By forming the corner cells, the outermost side of a channel region of which is an arc convex toward the corner of the semiconductor chip or a polygonal curve imitating the arc, in the corners of the semiconductor chip, the curvature of the pn junction is reduced and the localization of the electric field is suppressed. In addition, by expanding the area of the corner cell more widely than the area of the quadrangular cell, the avalanche energy absorption capability, and therefore, the avalanche withstand capability are improved.

Further, the provision of a shallow base region of the second conductivity type, the impurity concentration of which is higher than the impurity concentration of the channel region and the diffusion depth of which is shallower than the diffusion depth the channel region, in a portion of the surface layer of the channel region, improves the avalanche withstand capability, because the conductivity of the channel region increases, the base resistance of the parasitic transistor decreases, and therefore, the parasitic transistor hardly operates. Especially, by providing the region of the second conductivity type formed under the shallow base region only with the channel region, the avalanche withstand capability is improved even when the well region of the second conductivity type does not exist.

By disposing a gate electrode on each channel region and by connecting the gate electrodes spaced one another, the resistance of the gate electrode is effectively reduced.

In addition, by joining the channel regions by the lateral impurity diffusion with their gate electrode remaining on them, a processing step for connecting the gate electrodes becomes unnecessary.

Figure 2A:
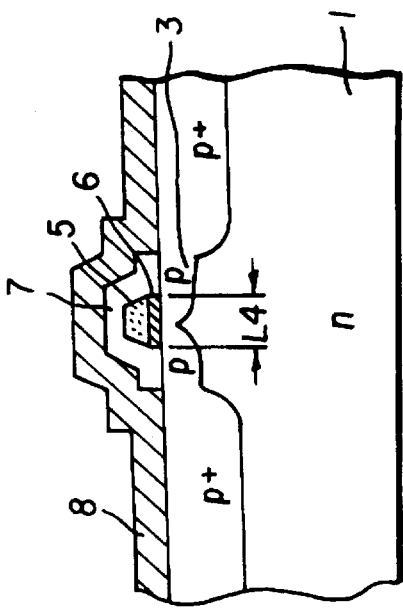
FIG. 2(a) is a sectional view along A—A of FIG. 1, and FIG. 2(b) a sectional view along B—B of FIG. 1.
Figure 2B:
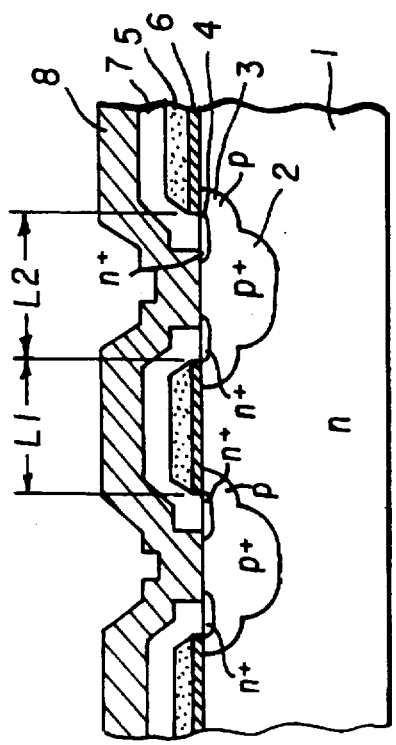
Figure 4A:
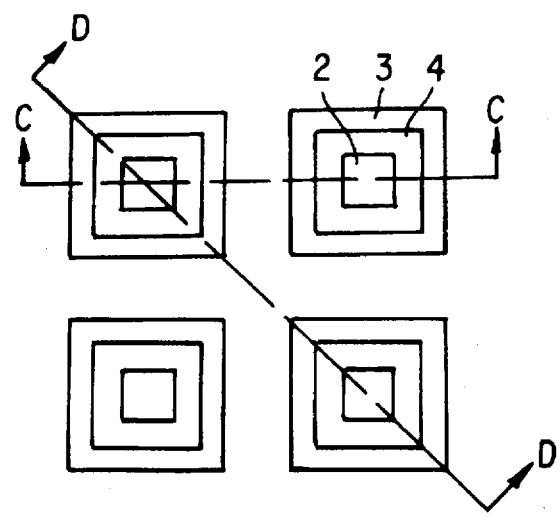
FIG. 4(a) is a top plan view showing an example of the MOSFET according to the prior art from which an upper structure of the MOSFET is omitted.
Figure 4B:
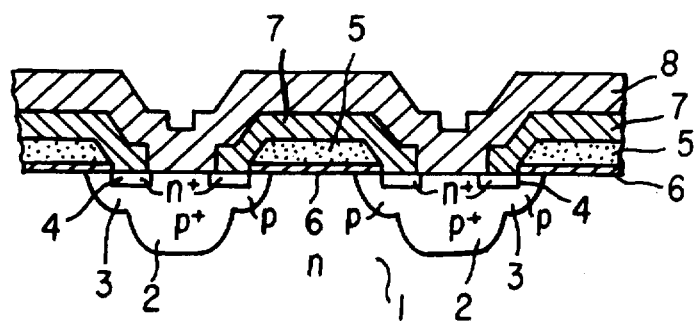
FIG. 4(b) is a sectional view along C—C of FIG. 4(a)
Figure 4C:
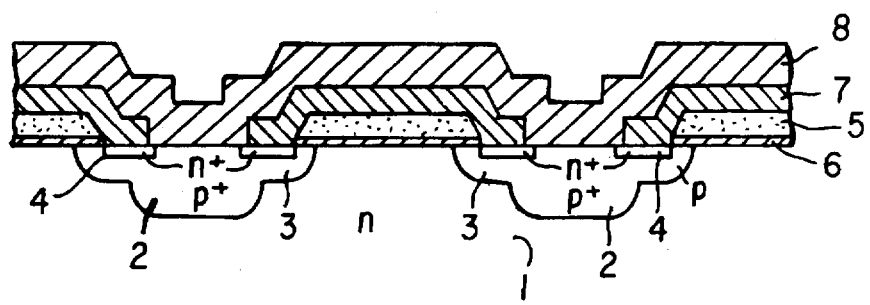
FIG. 4(c) is a sectional view along D—D of FIG. 4(a)
Figure 5:
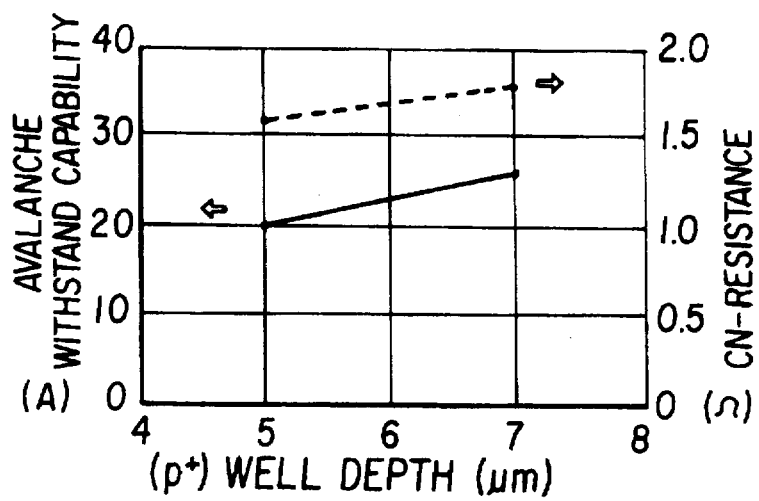
FIG. 5 is a graph showing the avalanche withstand capability and ON-resistance versus (p+) well depth relations of the MOSFET.

FIG. 1, FIG. 2(a) and FIG. 2(b) show an embodiment of a MOSFET of the present invention. FIG. 1 is a top plan view, FIG. 2(a) a sectional view along A—A of FIG. 1, and FIG. 2(b) a sectional view along B—B of FIG. 1. In FIGS. 1, 2(a) and 2(b), the same parts with those in FIGS. 4 are designated by the same reference numerals.

As shown in FIG. 1, rectangular (p) type channel regions 3, which surrounds an (n+) source region 4 and a (p+) well region 2, are formed in a surface layer of an (n) type semiconductor layer 1. The short sides of the channel regions are joined in parallel to the short sides of their neighbors. The joint boundary is shown in the figure by a single dotted chain line segment. Throughout the embodiments of the present invention, the quadrangular cell is represented by a rectangular cell. The quadrangular cell may be square in some MOS type devices. The actual corners of the (p) type channel regions or the (n+) source region 4 are not right angle, and somewhat curved with a radius of curvature of 1.5 to 2 µm. The (p) type channel region 3 is formed in the surface layer of the (n) type layer 1 with resistivity of 45 Ω cm and thickness of 100 µm. The (p+) well region 2 deeper than the (p) type channel region 3 is formed from the surface of the (p) type channel region 3, and the (n+) source regions 4, 4 are formed in the surface layer of the (p) type channel region 3. A poly-crystalline silicon gate electrode 5 is disposed through a gate oxide film 6 on the surface of the (p) type channel region 3 and over the exposed portion of the layer 1 between the (n+) source regions 4, 4. A source electrode 8 is disposed in common contact with the (n+) source regions 4, 4 and the (p+) well region 2 and extends over the gate electrode 5 through an inter layer insulation film 7. Though not shown, a drain electrode is deposited on the back surface of the (n) type layer 1 through an (n+) substrate.

The MOSFET of FIGS. 1 and 2 operates as follows. When a positive voltage of more than a predetermined value is applied to the gate electrode 5, an inversion layer is yielded near the surface of the (p) type channel region 3 below the gate electrode 5 and the portion between the n(+) source region 4 and the (n) type layer 1 becomes conductive. A current flows if a voltage is applied at this instance between the drain electrode 13 disposed on the back surface of the (n) type layer 1 and the source electrode 8. Therefore, it is necessary for the exposed portion of the (n) type layer 1 to have an area wide enough to flow the current.

FIG. 2(b) clearly shows the joint of two (p) type channel regions. In this cross section, the (n+) source region is not formed in the surface layer of the (p) type channel region 3. On the surface of the region in which the type channel regions are joined, the fine poly-crystalline silicone gate electrode 5 is deposited through the gate oxide film 6. The fine gate electrode 5 links two wide gate electrodes 5, 5 of two neighboring cells extending in parallel to the plane of the paper. The gate electrode 5 and the source electrode 8 are insulated from one another by the inter-layer insulation film 7.

Referring back to FIG. 1, the (p) type channel regions 3 are arranged in a lattice and, due to this, lack corners which protrude outside in convex shape in the prior art. Because of this, since withstand voltage lowers at the corners, in which the small curvature of the depletion layer causes the breakdown most often, and the localization of the avalanche currents to the corners are avoided, the avalanche withstand capability is improved. Though the portions surrounded by the cells are wide and the avalanche currents are large in the surrounded portions, the almost straight pn junctions opposed facing endure the large avalanche currents. Further, since the (n) type layer 1 extends widely beneath the gate electrode 5 between the peripheries of the cells in the section of FIG. 2(a), wide current paths are secured when the MOSFET is conductive and the ON-resistance is suppressed at low value.

In FIG. 1, the left side and the undermost side are the edges of the MOSFET chip 12. Peripheral cells 19, the outermost side of which lies in parallel to the side of the semiconductor chip 12, and corner cells 20, the outermost side of which is arched toward the corner of the semiconductor chip 12, are arranged outside the portion of the semiconductor chip 12 in which the rectangular cells are arranged. Since the curvature of the outermost pn junctions become small by this arrangement, the electric field hardly localizes and the avalanche withstand capability is improved. An n(+) source region 4 or n(+) source regions 4, 4 are formed in a portion of the peripheral cell 19 or in portions of the corner cell 20 located on the inner side of the chip 12. The avalanche withstand capability is improved for the following reason. Though the avalanche breakdown usually starts at first from the outermost pn junction, since the portion lacks any n(+) source region, the parasitic transistor does not operate even when a large avalanche current flows and the avalanche withstand capability is improved. Since the peripheral cell 19 and the corner cell 20 absorbs more avalanche energy by virtue of their wider areas than that of the rectangular (quadrangular) cell, the avalanche withstand capability is further improved. The broken line near the peripheral cell 19 indicates a boundary of the polycrystalline silicon ring 18. The outermost side of the (p) type channel region of the corner cell 20 is not necessarily an arc convex towards the corner f the semiconductor chip 12. Even an outermost polygonal side imitating an arc is effective for avoiding the electric field localization.

Figure 3:
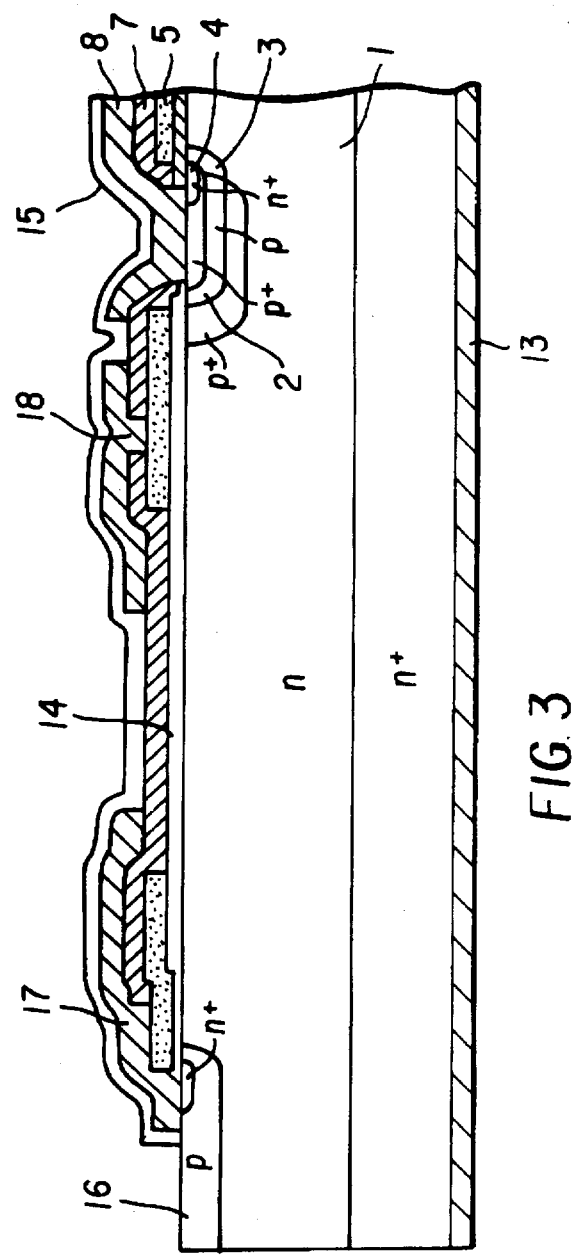
FIG. 3 is a sectional view showing a portion around the periphery of the MOSFET chip of FIG. 1.

FIG. 3 is a sectional view showing a portion around the edge of the MOSFET chip 12. A drain electrode 13 is disposed on the back surface of the (n) type layer 1 through the (n+) substrate. A poly-crystalline silicon ring 18 for leading out gate leads is disposed on the outermost p(+) well region 2 through a thick field oxide film 14, and a (p) type peripheral region 16 is disposed in the surface layer of the periphery of the chip 12. A peripheral electrode 17 is disposed on the (p) type peripheral region 16.

The parameters of each part are as follows. The impurity concentration of the (n) type layer 1 is $1 \times 10^{13}$ to $3 \times 10^{16}$ $cm^{-3}$; the thickness of the (n) type layer 1 is 5 to 150 µm; the boron ion dose amount in the p(+) well region 2 is $5 \times 10^{14}$ to $2 \times 10^{15}$ $cm^{-2}$; the diffusion depth of the p(+) well region 2 is 5 to 10 µm; the boron ion dose amount in the (p) type channel region 3 is $3 \times 10^{13}$ to $5 \times 10^{14}$ $cm^{-2}$; the diffusion depth of the (p) type channel region 3 is 2 to 4 µm; the arsenic ion dose amount in the n(+) source region 4 is $4\times10^{15}$ to $5\times10^{15}$ cm$^{-2}$; the diffusion depth of the n(+) source region 4 is 0.2 to 0.3 µm; the thickness of the gate electrode (polycrystalline silicon) 5 is 500 to 1000 nm; the thickness of the gate oxide film 6 is 25 to 120 nm; the thickness of the inter layer insulation film (BPSG) 7 is 0.6 to 1.1 µm; the thickness of the source electrode (Al—Si) S is 3 to 5 µm; the thickness of the field oxidation film 14 is 500 to 1100 nm; and the thickness of the passivation film (SiN) is 800 nm. The width L1 of the poly-crystalline silicon gate electrode 5 of FIG. 1 is 6 to 40 µm; the spacing L2 between the gate electrodes 5, 5 is 6 to 20 µm; the length L3 of the (n+) source region 4 is 12 to 200 µm; and the width L4 of the fine gate electrode 5 is 4 to 6 µm. As for the (p) type base region, the following three combinations can be adopted: (1) the (p) type channel region 3 and the p(+) well region 2; (2) the (p) type channel region 3 and a shallow p(+) base region 11; (3) the (p) type channel region 3, the p(+) well region 2, and the shallow p(+) base region 11.

The MOSFET of FIGS. 1 and 2 is manufactured through following steps. First, an epitaxial wafer is prepared by laminating an (n) type semiconductor layer 1 on an (n+) type substrate. A (p+) well 2 is formed by selectively doping acceptor type impurities from the surface of the semiconductor layer 1. A polycrystalline silicon film is deposited by CVD under reduced pressure on a gate oxide film 6 formed by thermal oxidation. The polycrystalline silicon film is patterned with a shape of a gate electrode 5. A (p) type channel region 3 and (n+) source regions 4, 4 are self-aligned by ion-implantation using the edges of the gate electrode 5 as masks for the self-alignment and by subsequent thermal diffusion. An inter-layer insulation film 7 of BPSG is deposited by the CVD method on the gate electrode 5. Windows are opened on the (p+) well 2 and the source regions 4, 4, and the source electrode 8 of Al—Si alloy is disposed. A nitride passivation film 15 is laminated on the source electrode 8. Finally the drain electrode 13 is deposited on the back surface of the (n+) type substrate. In FIG. 1, the portions, on which the polycrystalline silicon for the gate electrode 5 and the polycrystalline silicon ring 18 are deposited, are indicated by hatching. Below the fine gate electrode 5 which connects the gate electrodes 5 on the (n) type layer 1, the (p) type channel regions 3, 3 are joined by lateral impurity diffusion. Many fine gate electrodes 5, which are fine enough to join the channel regions by lateral impurity diffusion, are effective to lower the resistance against the currents flowing through the gate electrodes and to uniformly bias the gate electrode. Thus, the first embodiment of the MOSFET can be manufactured by changing the mask pattern without adding any extra steps to the manufacturing process of the MOSFET of the prior art.

Figure 8:
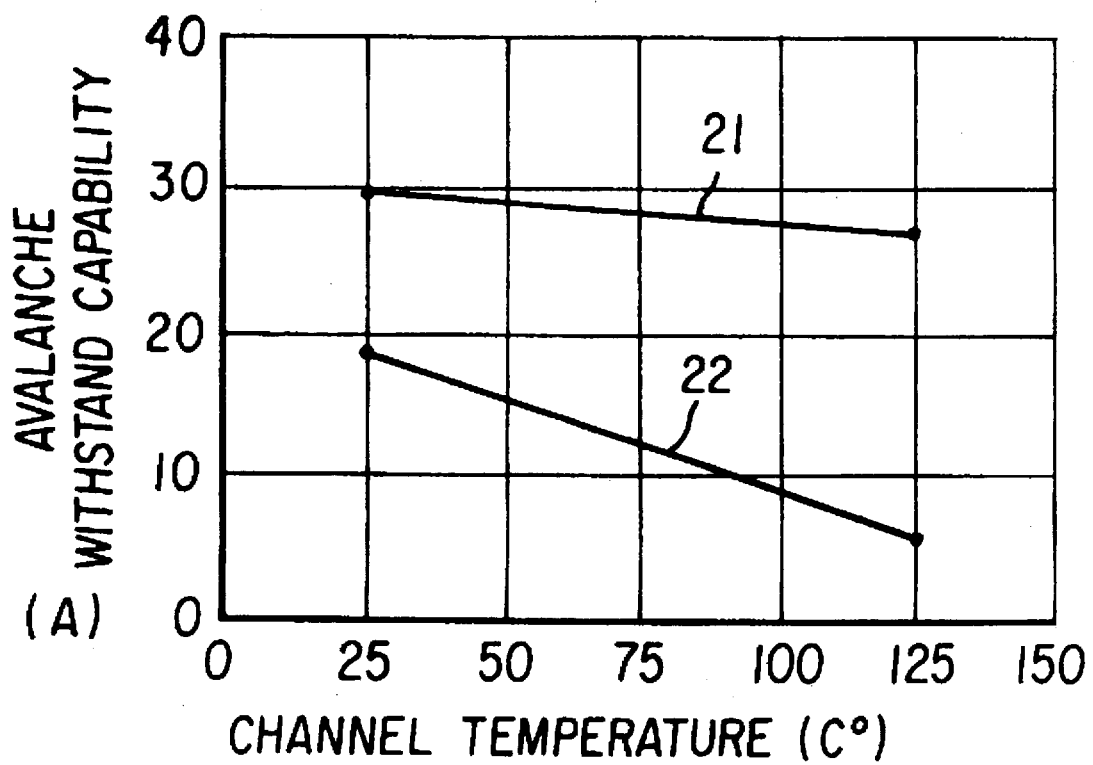
FIG. 8 is a graph comparing the temperature variation of the avalanche withstand capabilities of the MOSFETs of the present invention and the conventional MOSFET.

FIG. 8 is a graph for comparing the temperature dependence of the avalanche withstand capability of the MOSFET of FIGS. 1 and 2 of the present invention with that of the conventional MOSFET of FIG. 4. The withstand capability of the embodiment of the MOSFET of the present invention shown by a line 21 is 1.6 times at 25° C. and 4.7 times at 125° C. as large as the withstand capability of the conventional MOSFET.

Figure 9:
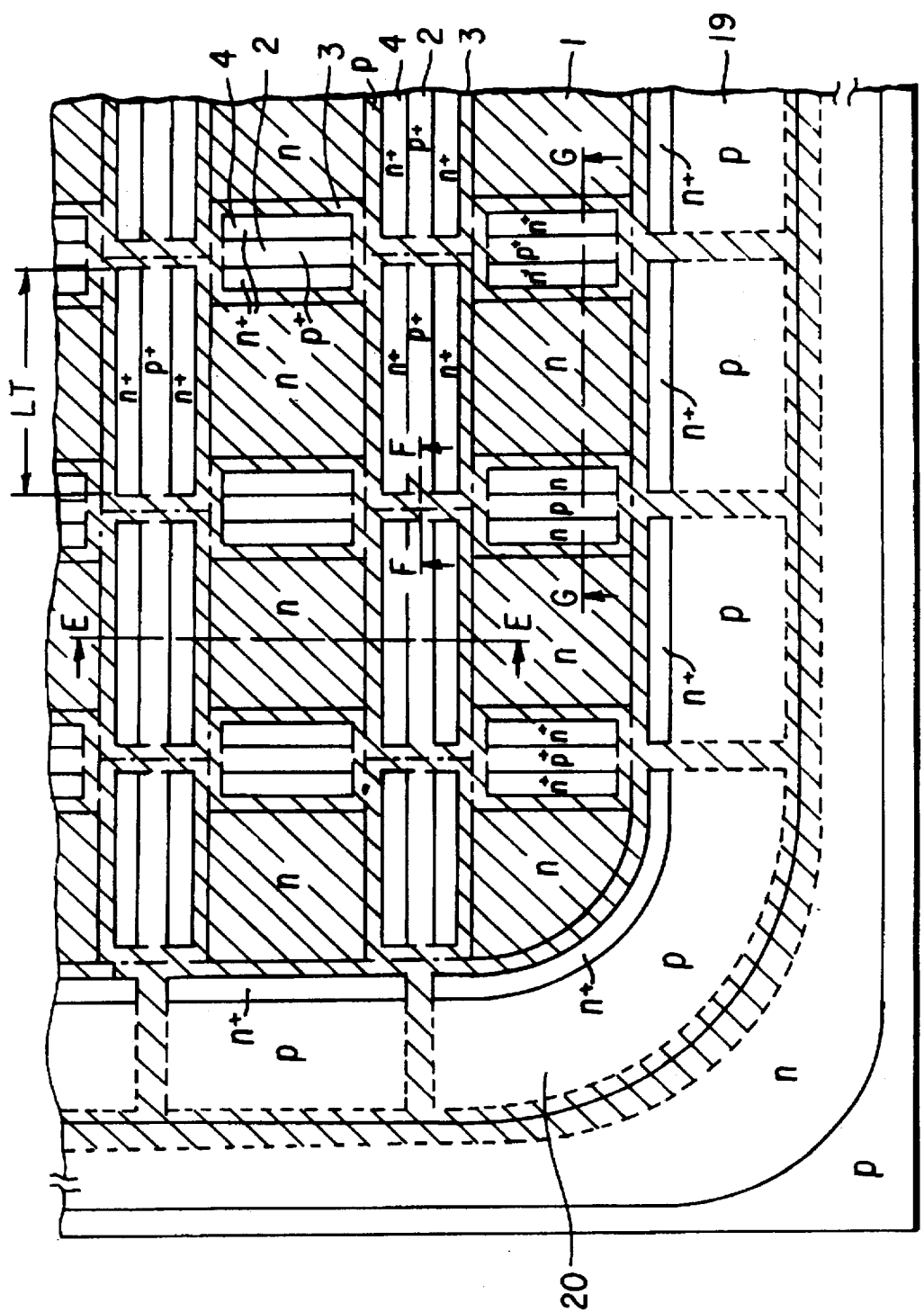
FIG. 9 is a top plan view showing the second embodiment of the MOSFET according to the present invention from which an upper structure of the MOSFET is omitted.
Figure 11A:
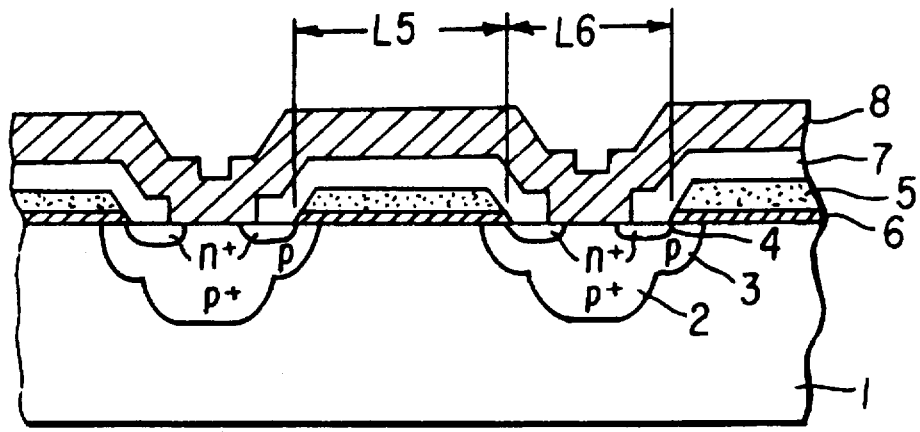
FIG. 11(a) is a sectional view along E—E of FIG. 9, and FIG. 11(b) a sectional view along F—F of FIG. 9.
Figure 11B:
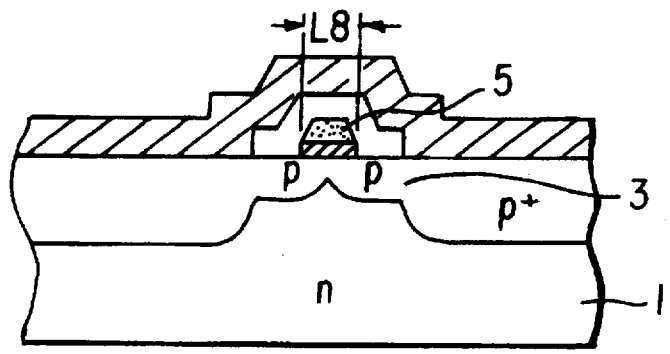

FIGS. 9, 11(a) and 11(b) show the second embodiment of the MOSFET according to the present invention. FIG. 9 is a top plan view from which an upper structure of the MOSFET is omitted. FIG. 11(a) a sectional view along E—E of FIG. 9, and FIG. 11(b) a sectional view along F—F of FIG. 9(a). In FIGS. 9, 11(a) and 11(b), the same parts with those in the figures already explained are designated by the same reference numerals. The embodiment of FIG. 9 is a modification of the first embodiment. In FIG. 9, the short sides of the two rectangular cells are joined in parallel and a short side of another cell is joined in perpendicular to the joined short sides. In FIG. 9, the n(+) source regions 4, 4 are formed in the joined (p) type channel regions 3, and the p(+) well region 2 is formed between the n(+) source regions 4, 4. Square exposed regions of the (n) type layer 1 are surround by the orthogonally arranged (p) type channel regions 3. The cross sectional view of FIG. 11(a) is almost the same with that of FIG. 2(a). That is, the (p) type channel region 3 having the deep (p+) well 2 in it is formed in the surface layer of the (n) type semiconductor layer 1. The (n+) source regions 4, 4 are formed in the surface layer of the channel regions 3. The gate electrode 5 is disposed through the gate oxide film 6 on the surface of the (p) type channel region 3 and on the (n) type semiconductor layer 1 sandwiched between the (n+) source regions 4 and 4. The source electrode 8 is disposed so as to commonly contact with the (n+) source region 4 and the (p+) well region. It is easily suspected that the sectional view along the line segment G—G of FIG. 9 is almost the same with that of FIG. 11(b). In the cross section along the line segment F—F of FIG. 9, two (p) type channel regions 3, 3 are joined in the similar arrangement as shown in FIG. 11(b). That is the (p) type channel regions 3, 3 are joined in the surface layer of the (n) type layer 1. The fine gate electrode 5 is disposed above the joined channel regions 3, 3 through the gate oxide film 6. Thus, by joining the (p) type channel regions 3, the lowering of the withstand voltage at the cell corners and the lowering of the withstand capability are prevented. The width L8 of the gate electrode 5 is 2 to 6 µm on the joined portion of the channel regions. In the section shown in FIG. 11(a), two cells are spaced widely enough and the (n) type layer 1 is exposed, below the gate electrode 5, widely enough to suppress the ON-resistance of the MOSFET at a low value when the MOSFET is conductive. The width L5 of the gate electrode 5 is 16 to 190 µm, the spacing L6 between the gate electrodes 5, 5 is 6 to 20 µm and the length L7 of the (n+) source region 4 is 12 to 200 µm in this cross section. In the second embodiment too, the peripheral cells 19 are formed in the outermost periphery of the portion of the semiconductor chip, inside which the rectangular cells are formed, as shown in FIG. 9. The outermost side of (p) type channel region 3 of the peripheral cell 19 lies in parallel to the side of the semiconductor chip, and the n(+) source region 4 in the peripheral cell 19 is located on the inner side of the semiconductor chip. The peripheral cell 19 occupies a wider area than the rectangular cells. The outermost side of the (p) type channel region 3 of the corner cell 20 arches toward the corner of the semiconductor chip, and the corner cell 20 occupies a wider area than the peripheral cell 19. By this configuration, the second embodiment also contributes to the improvement of the avalanche withstand capability.

The second embodiment of FIG. 9 is more preferable to first embodiment of FIG. 1 for lowering the ON-resistance, since the areas of the (p) type channel region 3 and the (n+) source region 4 are wider in the second embodiment.

The second embodiment of the present MOSFET can be also manufactured only by changing the mask pattern without adding extra processing steps to the processing steps for the MOSFET of the prior art.

Figure 10:
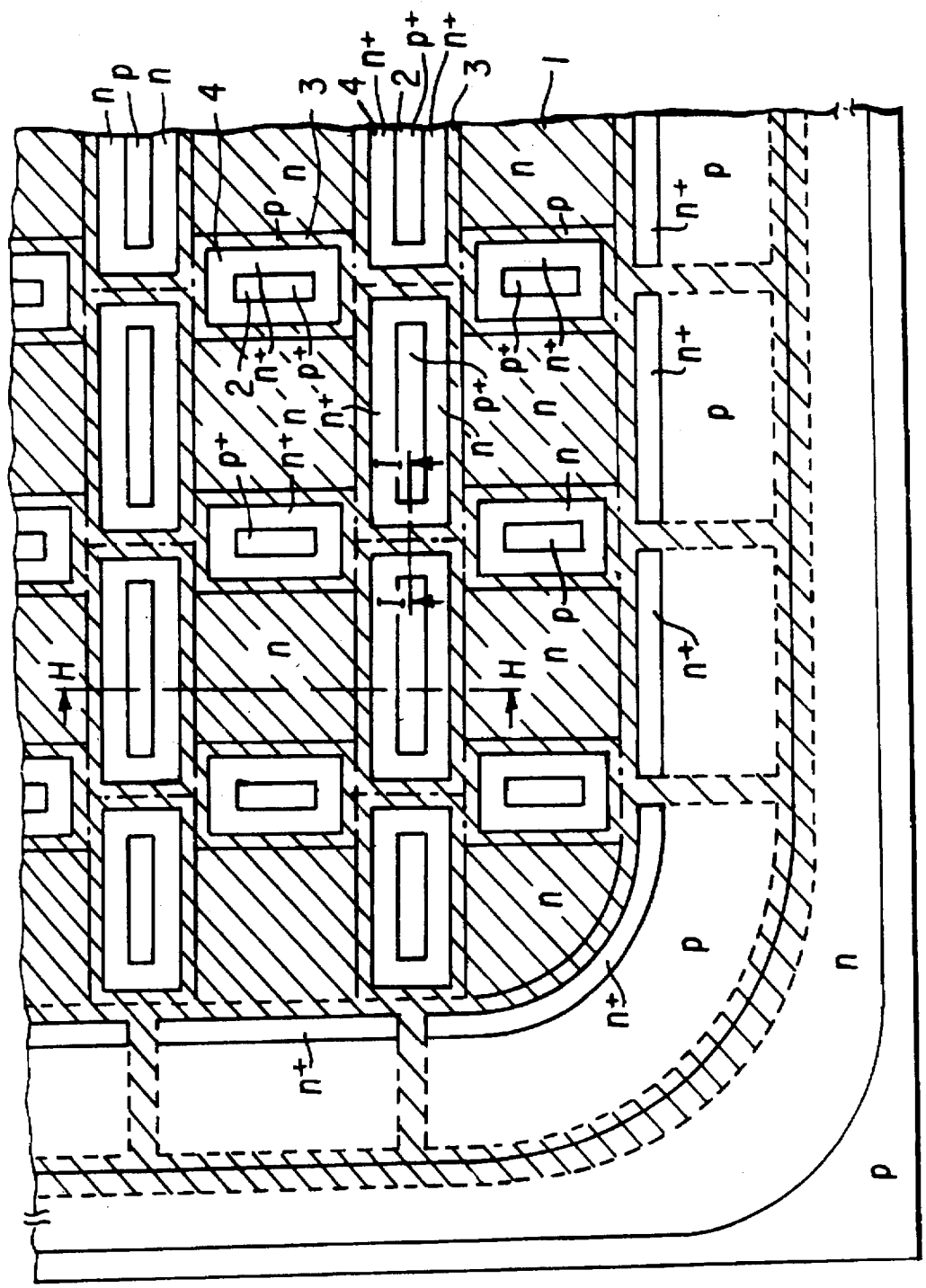
FIG. 10 is a top plan view showing the third embodiment of the MOSFET according to the present invention from which an upper structure of the MOSFET is omitted.
Figure 12:
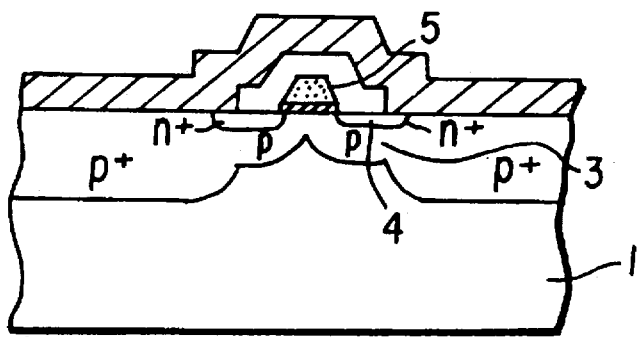
FIG. 12 as a sectional view along I—I of the third embodiment of FIG. 10.

FIGS. 10 shows the third embodiment of the MOSFET according to the present invention. FIG. 10 is a top plan view from which an upper structure of the MOSFET is omitted. In FIG. 10, the same parts with those in the figures already explained are designated by the same reference numerals. The third embodiment is a modification of the second embodiment of FIG. 9. The cells are arranged orthogonally to form a lattice similarly as in the second embodiment. However, the third embodiment is different from the second embodiment in that an (n+) source region 4 is formed in a rectangular ring in the cell. Therefore, the cross section along H—H in FIG. 10 is almost similar to that of FIG. 11 (a). However, the cross section along I—I of FIG. 10 shown in FIG. 12 is different from that shown in FIG. 11(b). That is, the (n+) source regions 4, 4 exist also in the joint portion of the (p) type channel regions 3, 3. The third embodiment further reduces the ON-resistance, since the third embodiment widens the area of the (n+) source region 4.

Figure 13:
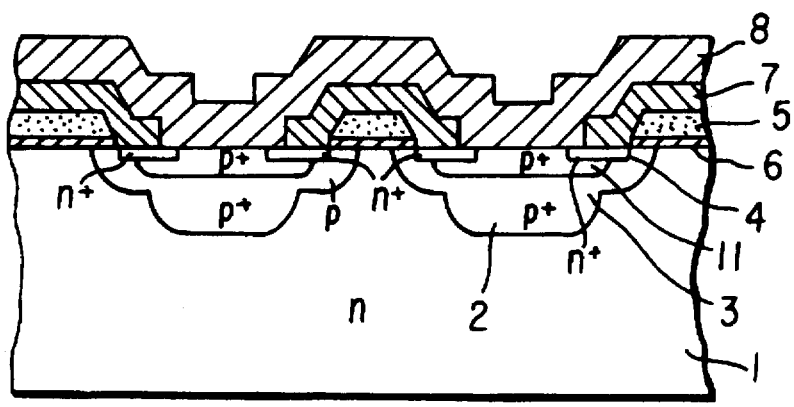
FIG. 13 is a sectional view showing the fourth embodiment of the MOSFET according to the present invention.

FIG. 13 is a sectional view showing the fourth embodiment of the MOSFET according to the present invention. In FIG. 13, the same parts with those in the figures already explained are designated by the same reference numerals. In the fourth embodiment, a shallow p(+) base region 11 with shallow diffusion depth and with higher impurity concentration than that of the (p) type channel region 3 of FIG. 1 is formed in a part of the surface layer of the (p) type channel region 3. The shallow p(+) base region 11 is formed, for example by implanting boron ions at the ion dose amount of $1 \times 10^{15}$ to $3 \times 10^{15}$ cm$^{-2}$ and by heat treatment to the diffusion depth of 0.5 to 1 µm. Since the channel resistance is lowered by the shallow p(+) base region 11, the operation of the parasitic transistor is suppressed and the avalanche withstand capability is improved.

Figure 14:
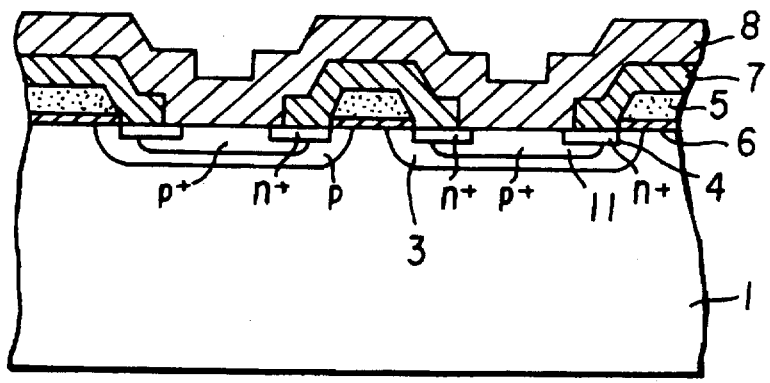
FIG. 14 is a sectional view showing the fifth embodiment of the MOSFET according to the present invention.

FIG. 14 is a sectional view showing the fifth embodiment of the MOSFET according to the present invention. In FIG. 14, the same parts with those in the figures already explained are designated by the same reference numerals. In the fifth embodiment, the shallow p(+) base region 11 with higher impurity concentration than that of the (p) type channel region 3 is formed in a part of the surface layer of the (p) type channel region 3 similarly as in the fourth embodiment of FIG. 13. However, the p(+) well region 2 is not formed in the fifth embodiment. Since the channel resistance is lowered by the provision of the shallow p(+) base region 11 as well as by the improvement of the cell arrangement, the operation of the parasitic resistance is suppressed and the avalanche withstand capability is improved. Therefore, the practically acceptable avalanche withstand capability is obtained and the problem of the ON-resistance decrease mentioned earlier is solved without forming the p(+) well region 2. Since the p(+) well region 2 with deep diffusion depth can be omitted, time and cost for manufacturing the MOSFET is greatly reduced.

Figure 15:
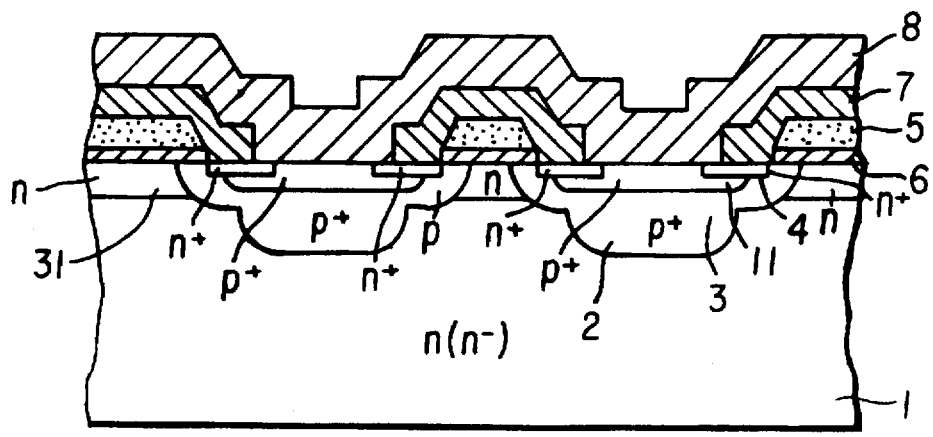
FIG. 15 is a sectional view showing a sixth embodiment of a MOSFET according to the present invention.

FIG. 15 is a sectional view showing a sixth embodiment of a MOSFET according to the present invention. The sixth embodiment is a modification of any one of the first through fifth embodiments, and FIG. 15 corresponds to FIG. 13. The sixth embodiment differs from the first through sixth embodiments in that a semiconductor region 31 of the same conductivity type as the semiconductor layer 1 is formed in a surface region of the latter. A feature of the sixth embodiment is that the resisitiviy of the semiconductor region 31 is lower than that of the semiconductor layer 1. In FIG. 15, this is exemplified by n⁻type for the semiconductor layer 1 and n type for the semiconductor region 31. While, generally, the resistivity of the semiconductor region 31 should be higher than that of the source region(s) 4 this is not essential. The phosphor ion dose amount for the n type semiconductor 31 is preferably $5 \times 10^{11}$ to $5 \times 10^{12}$ cm$^{-2}$ and the diffusion depth of the semiconductor region 31 is preferably 2 to 4 microns. The semiconductor region 31 enables higher doping concentration than the prior art does and results in a lower on-resistance. In addition, a smaller area for one element of the device, which is possible thanks to the low resistivity of the semiconductor region 31, decreases the gate-drain capacitance, which in turn makes faster switching possible. The sixth embodiment can be combined with any of the first to fifth embodiments.

Though the present invention has been explained by the embodiments of the MOSFETs, the present invention is applicable to the MOS semiconductor devices such as bipolar transistors, MCTs (MOS control thyristors), etc. which have a MOS structure. According to the present invention, lowering of the withstand voltage around the corners of the rectangular (quadrangular) cell of the MOS type semiconductor device and lowering of the avalanche withstand capability can be prevented by joining the sides of the rectangular cells so as to remove the cell corners. The arrangement which joins the side of the cell perpendicularly to the joined sides of the other cells is also effective. The avalanche withstand capability is also improved by minimizing the curvature of the pn junctions in the peripheral and corner cells surrounding the quadrangular cells, and by widening the areas of the peripheral and corner cells. The avalanche withstand capability is further improved by lowering the channel resistance by means of the heavily doped shallow base region formed in the channel region.

What is claimed is:

1. A MOS type semiconductor device, comprising:
   a semiconductor layer of a first conductivity type; and
   a plurality of MOS type rectangular cells, each having four major sides including short and long major sides, a channel region of a second conductivity type formed in a surface layer of the semiconductor layer, and at least one source region of the first conductivity type formed in a surface layer of the channel region, at least two sides of said source region lying in parallel to at least two sides of the channel region;
   wherein channel regions of first and second neighboring cells, which have major sides facing each other in parallel, are joined along facing major short sides thereof; and
   wherein the channel region of a third cell along a major short side of the third cell is joined with the joined channel regions of the first and second cells, the major short side of said third cell being perpendicular to the facing major short sides of said first and second cell.

2. The device as claimed in claim 1, wherein a base region of a second conductivity type is formed in a portion of the surface layer of the channel region, an impurity concentration of the base region being higher and its diffusion depth being shallower than those of the channel region.

3. The device as claimed in claim 1, wherein a gate electrode is formed on each joined portion of the channel regions.

4. The device as claimed in claim 1, wherein each joined portion of the channel regions comprises a lateral impurity diffusion layer.

5. The MOS type semiconductor device as claimed in claim 1, wherein a further region of the first conductivity type is formed in the surface area of the semiconductor layer extending between the channel regions along major sides of neighboring cells which are not joined, the further region having an impurity concentration higher than that of the semiconductor layer.

6. The MOS type semiconductor device as claimed in claim 1, wherein a further region of the first conductivity type is formed in the surface area of the semiconductor layer extending between the channel regions along major sides of neighboring cells which are not joined, the further region having an impurity concentration higher than that of the semiconductor layer.

7. A MOS type semiconductor device, comprising:

a semiconductor layer of a first conductivity type; and a plurality of MOS type rectangular cells, each having four major sides including short and long major sides, a channel region of a second conductivity type formed in a surface layer of the semiconductor layer, and at least one source region of the first conductivity type formed in a surface layer of the channel region, at least two sides of said source region lying in parallel to at least two sides of the channel region;

wherein channel regions of first and second neighboring cells, which have major sides facing each other in parallel, are joined along facing major short sides thereof, wherein said plurality of rectangular cells are formed in a central portion of a semiconductor chip and MOS type peripheral cells are formed in a peripheral portion of the semiconductor chip, each peripheral cell including a channel region of the second conductivity type and a source region of the first conductivity type; and wherein at least a portion of an outermost side of a channel region of each peripheral cell lies in parallel to a respective side of the semi-conductor chip and the width of the peripheral cell is greater that of a rectangular cell.

8. The device as claimed in claim 7, wherein MOS type corner cells are formed in the peripheral portions corresponding to corners of the semiconductor chip, each corner cell including a channel region of the second conductivity type and a source region of the first conductivity type, and wherein the outermost side of the channel region of each corner cell substantially forms an arc convex toward the respective corner of the semiconductor chip and the area of a corner cell is greater than the area of a peripheral cell.

9. The MOS type semiconductor device as claimed in claim 8, wherein the area of the corner cell is wider than the area of the peripheral cell.

10. The device as claimed in claim 7, wherein a base region of a second conductivity type is formed in a portion of the surface layer of the channel region, an impurity concentration of the base region being higher and its diffusion depth being shallower than those of the channel region.

11. The device as claimed in claim 7, wherein a gate electrode is formed on each joined portion of the channel regions.

12. The device as claimed in claim 7, wherein each joined portion of the channel regions comprises a lateral impurity diffusion layer.

13. The device as claimed in claim 7, wherein a further region of the first conductivity type is formed in a surface area of the substrate extending between the channel regions of neighboring cells along those major sides of said cells which are not jointed, the further region having an impurity concentration higher than that of the substrate.

* * * * *